(12) United States Patent
Hwang et al.

(10) Patent No.: US 12,525,583 B2
(45) Date of Patent: Jan. 13, 2026

(54) MICRO SEMICONDUCTOR CHIP TRANSFER SUBSTRATE, DISPLAY TRANSFERRING STRUCTURE, DISPLAY DEVICE, AND METHOD OF MANUFACTURING THE DISPLAY DEVICE

(71) Applicant: SAMSUNG ELECTRONICS CO., LTD., Suwon-si (KR)

(72) Inventors: Junsik Hwang, Hwaseong-si (KR); Seogwoo Hong, Yongin-si (KR); Kyungwook Hwang, Seoul (KR); Hyunjoon Kim, Seoul (KR); Joonyong Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 821 days.

(21) Appl. No.: 17/793,145

(22) PCT Filed: Jan. 27, 2022

(86) PCT No.: PCT/KR2022/001455
§ 371 (c)(1),
(2) Date: Jul. 15, 2022

(87) PCT Pub. No.: WO2022/169199
PCT Pub. Date: Aug. 11, 2022

(65) Prior Publication Data
US 2024/0178195 A1  May 30, 2024

Related U.S. Application Data

(60) Provisional application No. 63/145,150, filed on Feb. 3, 2021.

(30) Foreign Application Priority Data

May 4, 2021 (KR) .......................... 10-2021-0058127
Jan. 25, 2022 (KR) .......................... 10-2022-0011048

(51) Int. Cl.
| | | |
|---|---|---|
| H01L 25/075 | (2006.01) | |
| H01L 25/16 | (2023.01) | |
| H10H 20/851 | (2025.01) | |

(52) U.S. Cl.
CPC ........ *H01L 25/0753* (2013.01); *H01L 25/167* (2013.01); *H10H 20/851* (2025.01)

(58) Field of Classification Search
CPC .............. H01L 25/0753; H01L 25/167; H01L 2224/16; H01L 2224/18;
(Continued)

(56) References Cited

U.S. PATENT DOCUMENTS 6,919,007 B2  7/2005  Sanaka et al.
10,230,020 B2  3/2019  Sasaki et al.
(Continued)

FOREIGN PATENT DOCUMENTS

CN  111933774 A  11/2020
CN  110518098 B  12/2020
(Continued)

OTHER PUBLICATIONS

Machine translation of WO2019192041 Zhang et al. (year 2019).*
(Continued)

*Primary Examiner* — Victor A Mandala
(74) *Attorney, Agent, or Firm* — Sughrue Mion, PLLC

(57) ABSTRACT

According to an aspect of an embodiment, provided is a micro semiconductor chip transferring substrate including: a mold including a plurality of recesses formed to be recessed in a certain depth from an upper surface; and a surface energy reduction pattern formed in region between the plurality of recesses, on the upper surface, the surface energy reduction pattern including a plurality of uneven patterns. When the micro semiconductor chips are aligned by a wet alignment method, by such surface energy reduction pattern, (Continued)

sliding of the micro semiconductor chips toward the inside of the recesses may be improved.

19 Claims, 14 Drawing Sheets

(58) Field of Classification Search
CPC .......... H01L 2224/95001; H01L 24/95; H10H 20/851; H10H 20/852; H10H 20/01; H10H 20/857; H10H 20/819; H10H 20/84; H10H 20/8513; H10H 20/8515; H10H 20/882
See application file for complete search history.

(56) References Cited

U.S. PATENT DOCUMENTS

| | | | |
|---|---|---|---|
| 2004/0241894 A1 | 12/2004 | Nagai et al. | |
| 2017/0294565 A1* | 10/2017 | Kim | H10H 20/814 |
| 2018/0019369 A1 | 1/2018 | Cho et al. | |
| 2019/0393069 A1* | 12/2019 | Paranjpe | B32B 7/12 |
| 2019/0393117 A1* | 12/2019 | Vockenberger | H01L 23/367 |
| 2020/0012146 A1* | 1/2020 | Lin | G02B 5/3058 |
| 2021/0013065 A1* | 1/2021 | Chen | H01L 24/83 |
| 2021/0082734 A1* | 3/2021 | Chang | H10H 20/01 |
| 2021/0098278 A1 | 4/2021 | Chen | |
| 2022/0051924 A1* | 2/2022 | Kim | H01L 25/0753 |
| 2022/0102602 A1 | 3/2022 | Hwang et al. | |
| 2022/0109081 A1* | 4/2022 | Asada | H10H 20/01 |
| 2022/0122953 A1 | 4/2022 | Hwang et al. | |
| 2022/0189931 A1* | 6/2022 | Hwang | H10H 20/851 |
| 2022/0190193 A1* | 6/2022 | Hong | H01L 21/6835 |
| 2022/0230997 A1 | 7/2022 | Choi | |
| 2022/0246584 A1* | 8/2022 | Hwang | H10H 20/01 |
| 2022/0351992 A1 | 11/2022 | Kim et al. | |
| 2023/0253377 A1* | 8/2023 | Schuele | H10H 20/01 438/34 |
| 2024/0234219 A1* | 7/2024 | Oh | H01L 25/167 |

FOREIGN PATENT DOCUMENTS

| | | | |
|---|---|---|---|
| CN | 111739877 B | 12/2020 | |
| EP | 3989283 A1 | 4/2022 | |
| EP | 4024460 A1 | 7/2022 | |
| JP | 2001-257218 A | 9/2001 | |
| JP | 3844061 B2 | 11/2006 | |
| JP | 2013-131629 A | 7/2013 | |
| KR | 10-2014-0134038 A | 11/2014 | |
| KR | 10-2018-0007376 A | 1/2018 | |
| KR | 10-2019-0076929 A | 7/2019 | |
| KR | 10-2019-0106885 A | 9/2019 | |
| KR | 10-2020-0018521 A | 2/2020 | |
| KR | 10-2020-0026676 A | 3/2020 | |
| KR | 10-2020-0139332 A | 12/2020 | |
| KR | 10-2022-0041484 A | 4/2022 | |
| KR | 10-2022-0050674 A | 4/2022 | |
| WO | 2019/192041 A1 | 10/2019 | |
| WO | WO2019192041 * | 10/2019 | ........... 25/75 |
| WO | 2020/256203 A1 | 12/2020 | |

OTHER PUBLICATIONS

Communication dated Oct. 31, 2024, issued by the China National Intellectual Property Administration in Chinese Application No. 202280002438.6.
International Search Report (PCT/ISA/220) issued May 9, 2022 by the International Searching Authority in International Application No. PCT/KR2022/001455.
Communication issued Jun. 7, 2022 by the European Patent Office for European Patent Application No. 21213438.1.

* cited by examiner

MICRO SEMICONDUCTOR CHIP TRANSFER SUBSTRATE, DISPLAY TRANSFERRING STRUCTURE, DISPLAY DEVICE, AND METHOD OF MANUFACTURING THE DISPLAY DEVICE

CROSS-REFERENCE TO RELATED APPLICATIONS

This application is a National Stage of International Application No. PCT/KR2022/001455, filed Jan. 27, 2022, which claims priority to U.S. Provisional Patent Application No. 63/145,150, filed on Feb. 3, 2021, Korean Patent Application No. 10-2021-0058127, filed on May 4, 2021, and Korean Patent Application No. 10-2022-0011048, filed on Jan. 25, 2022, the contents of all of which are incorporated by reference herein in their entireties.

TECHNICAL FIELD

The disclosure relates to a micro semiconductor chip transfer substrate, a display transferring structure, a display device and method of manufacturing the display device.

BACKGROUND ART

Industrial demands for light-emitting diodes (LEDs) are increasing because of the advantages thereof of low power consumption and environmental friendliness, and the LEDs are applied to pixels of display devices, in addition to being used as lighting apparatuses or LCD backlights. In preparing display devices using micro LED chips, a pick and place method is used for transferring micro LEDs. However, the productivity of such a method is reduced as the sizes of the micro LEDs are reduced and the sizes of the displays are increased.

DESCRIPTION OF EMBODIMENTS

Technical Problem

Provided are a display transferring structure allowing micro semiconductor chips to be effectively arranged on a large-area substrate, and a display device using the display transferring structure.

Solution to Problem

According to an aspect of an embodiment, provided is a micro semiconductor chip transferring substrate including: a mold including a plurality of recesses formed to be recessed in a certain depth from an upper surface; and a surface energy reduction pattern formed in region between the plurality of recesses, on the upper surface, the surface energy reduction pattern including a plurality of uneven patterns.

A width of the uneven patterns may be 50% or less of a width of the recesses.

A space between adjacent uneven patterns among the plurality of uneven patterns may be less than a width of the plurality of recesses.

The space between adjacent uneven patterns among the plurality of uneven patterns, which is defined as s, may satisfy a condition.

$$s < (w1-w2)/2$$

wherein, w1 and w2 refer to the widths of the plurality of recesses and the plurality of uneven patterns, respectively.

The surface energy reduction pattern may include a plurality of convex patterns protruded upwards from the upper surface.

The plurality of convex patterns may include a different material from a material of the mold.

The convex patterns may be made of metal material.

The surface energy reduction pattern may further include a filling pattern including a different material from that of the convex pattern and filling regions between the plurality of convex patterns.

The surface energy reduction pattern and the mold may be integrally formed of a same material.

A plurality of concave patterns recessed from the upper surface of the mold to a lower portion may be included.

A recessed depth of the plurality of the concave patterns may be less than a depth of the plurality of recesses.

The surface energy reduction pattern may be formed by roughing the upper surface of the mold.

According to an aspect of an embodiment, provided is a display transferring structure including: any one micro semiconductor chip transferring substrate described above; and a micro semiconductor chip arranged on any one of the plurality of recesses.

The width of the uneven patterns may be 50% or less of a width of the micro semiconductor chips.

The space between adjacent uneven patterns among the plurality of uneven patterns, which is defined as s, may satisfy a condition:

$$s \leq (w3-w2)/2$$

wherein, w3 and w2 refer to widths of each micro semiconductor chip and each uneven pattern, respectively.

The display transferring structure may further include a driving circuit configured to drive the micro semiconductor chips.

The driving circuit may be arranged inside the micro semiconductor chip transferring substrate.

The display device may further include a circuit board arranged under the micro semiconductor chip transferring substrate and including the driving circuit.

According to an aspect of an embodiment, provided is a display device including: any one of the display transferring structures; a driving circuit configured to drive the micro semiconductor chips; and a color conversion layer arranged on the transferring substrate.

According to an aspect of an embodiment, provided is an electronic apparatus including the display device.

According to an aspect of an embodiment, provided is a method of manufacturing a display device including: aligning micro semiconductor chips in a plurality of recesses of any one of the micro semiconductor chip transferring substrates; and transferring the micro semiconductor chips onto a display substrate including a driving circuit configured to drive the micro semiconductor chips.

ADVANTAGEOUS EFFECTS OF DISCLOSURE

The micro semiconductor chip transferring substrate has a surface energy reduction pattern, thereby allowing micro semiconductor chips to easily be moved into and aligned in recesses.

In the display transferring structure, a plurality of micro semiconductor chips may be easily aligned in the correct position within a large area.

Using the display transferring structure, various types of display devices such as a large-area display device may be easily implemented.

MODE OF DISCLOSURE

Figure 1:
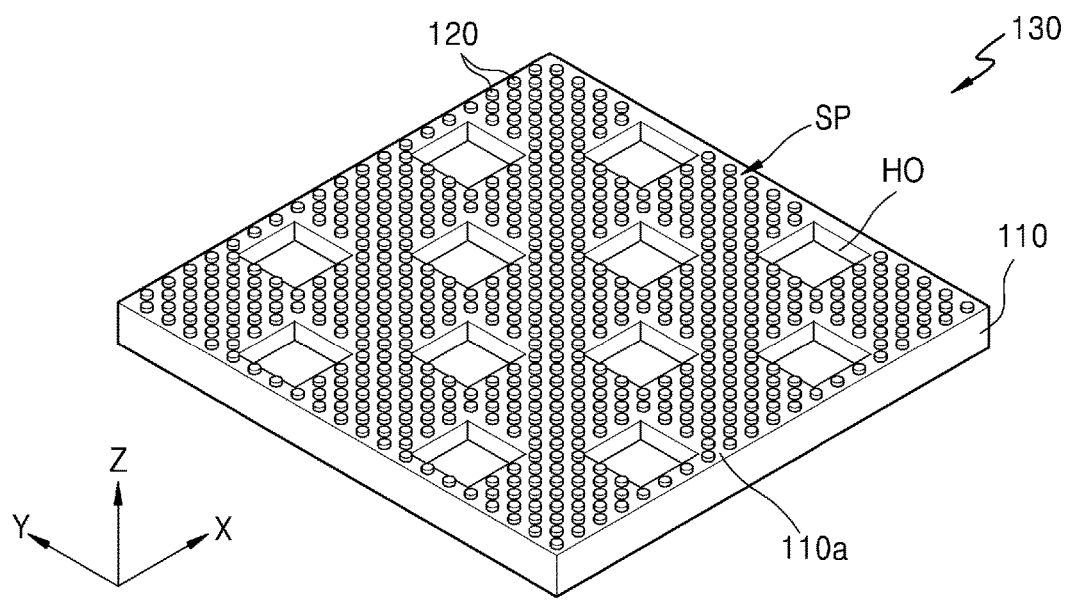
FIG. 1 is a schematic perspective view illustrating a structure of a micro semiconductor chip transferring substrate according to an embodiment.

Hereinafter, embodiments will be described in detail with reference to the accompanying drawings. Meanwhile, embodiments described below are provided only as an example, and thus can be embodied in various forms. In the drawings, like reference numerals denote like elements, and sizes of each component are exaggerated for clarity and convenience in explanation.

It will be understood that when a component is referred to as being "on" or "on the top of" another component, the component can be directly on, under, on the left of, or on the right of the other component, or can be on, under, on the left of, or on the right of the other component in a non-contact manner.

The terms 'first', 'second,' etc. may be used to describe various elements but are only used herein to distinguish one element from another element. The terms do not define that the components have different materials or structures from each other.

As used herein, the singular forms "a," "an" and "the" are intended to include the plural forms as well, unless the context clearly indicates otherwise. Throughout the specification, when a portion "includes" an element, another element may be further included, rather than excluding the existence of the other element, unless otherwise described.

In addition, the terms such as "unit", "module", etc. provided herein indicates a unit performing at least one function or operation, and may be realized by hardware, software, or a combination of hardware and software.

As used herein, in particular, terms such as "the" and demonstratives similar thereto used herein may be to indicate both the singular and the plural.

Unless explicitly stated that operations of a method should be performed in an order described below, the operations may be performed in an appropriate order. The use of any and all examples, or example language (e.g., "such as") provided herein, is intended merely to better illuminate the disclosure and does not pose a limitation on the scope of the disclosure unless otherwise claimed.

Figure 2:
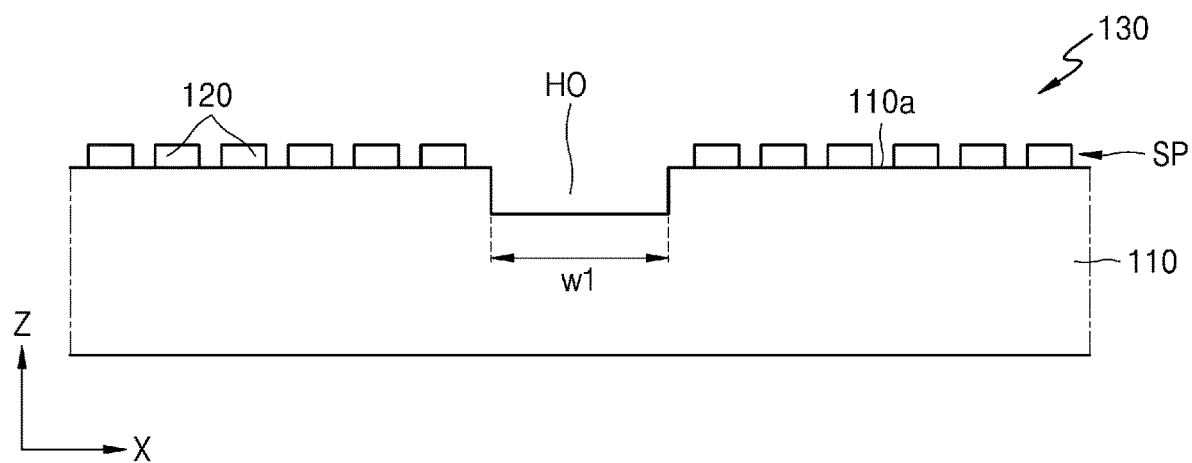
FIG. 2 is an enlarged cross-sectional view of a part of FIG. 1.

FIG. 1 is a schematic perspective view of a micro semiconductor chip transferring structure according to an embodiment, and FIG. 2 is an enlarged cross-sectional view of a part of FIG. 1.

A micro semiconductor chip transferring substrate 130 (hereinafter, also referred to as transferring substrate) may include a mold 110 including a plurality of recesses HO and a surface energy reduction pattern SP formed on an upper surface 110a of the mold 110 and including a plurality of uneven patterns formed on area between the plurality of recesses HO. In the present embodiment, the surface energy reduction pattern SP may include a plurality of convex patterns 120 protruded from the upper surface 110a of the mold 110.

The micro semiconductor chip transferring substrate 130 is for aligning the plurality of micro semiconductor chips (not shown) in the plurality of recesses HO through a fluid self-alignment (FSA) method. A cross-sectional shape of the micro semiconductor chips 140 is illustrated as a circle, but is not limited thereto, and may be, for example, rectangular. In addition, a shape of the recesses HO is illustrated as a rectangle, but is not limited thereto, and may be, for example, circular or oval. The shape of the recesses HO may correspond to the shape of the micro semiconductor chips to be aligned therein.

The surface energy reduction pattern SP including the plurality of convex patterns 120 formed on the transferring substrate 130 may be provided to lower the surface energy of the mold upper surface 110a connected to the recesses HO to prevent the micro semiconductor chips 140 from being fixed on the upper surface 110a of the mold 110. In other words, sliding of the micro semiconductor chips 140 on the upper surface 110a of the mold 110 may be improved by the surface energy reduction pattern SP, thereby allowing the micro semiconductor chips 140 to be easily moved into the recesses HO without being pressed in positions other than the correct position. For example, when the micro semiconductor chips dispersed in a predetermined suspension are supplied onto the micro semiconductor chip transferring substrate 130, and when the micro semiconductor chips are bonding-fixed on the upper surface 110a of the mold 110, not entering the recesses HO, a cleaning process for removing the micro semiconductor chips may be required. In addition, normally, because pressure processing for fixing the micro semiconductor chips 140 entered in the recesses HO is performed before the cleaning process, removing the micro semiconductor chips that are fixed on the outer surface 110a of the mold 110 is not easy and may degrade yield. Generally, the surface energy of the interface between two surfaces is proportional to the contact area, and therefore, when convex patterns 120 are provided, the surface energy of the interface between the bottom surface of the micro semiconductor chips and the transferring substrate 130 may decrease, and the micro semiconductor chips may easily be transferred into the recesses HO.

A width (w2) of the convex patterns 120 and a space(s) between the convex patterns 120 may be set such that the micro semiconductor chips 140 are not fixed on the convex patterns 120 or the upper surface 110a of the mold 110 and the path toward the recesses HO is not obstructed by the convex patterns 120. The cross-sectional shape of the convex patterns 120 is illustrated as a circle, but this is an example. The convex patterns 120 may be changed to have a polygonal shape, an annular shape, an oval shape, or any other shape.

The width w1 of the recesses HO may be formed to be greater than the width of the micro semiconductor chips to be mounted in the recesses HO. The width w1 of the recesses HO may be smaller than twice the width of the micro semiconductor chips such that two or more micro semiconductor chips cannot enter one recess HO.

Figure 3:
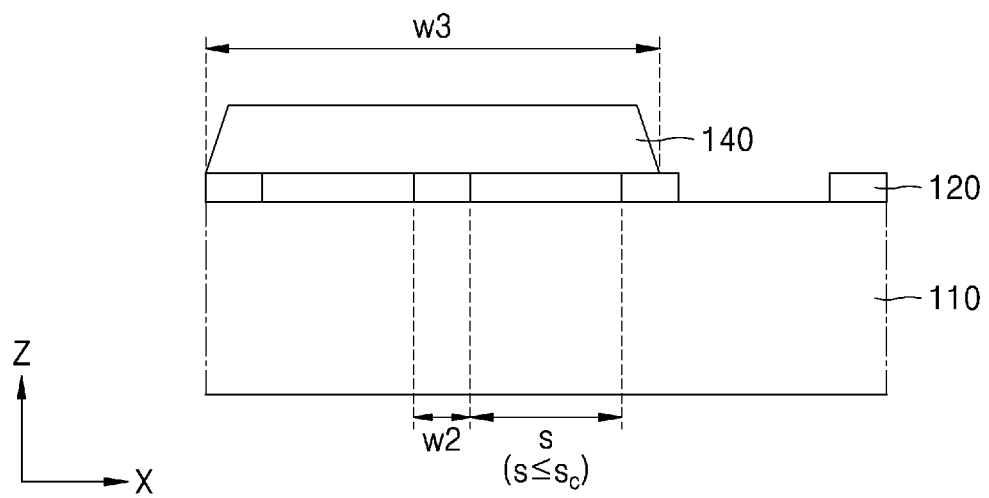
FIG. 3 is a conceptual view explaining a space requirement between uneven patterns provided on the micro semiconductor chip transferring substrate of FIG. 1 in relation to the sizes of micro semiconductor chips.

FIG. 3 is a conceptual view explaining a space requirement between convex patterns provided on the micro semiconductor chip transferring substrate of the display transferring structure of FIG. 1 in relation to the sizes of micro semiconductor chips.

A width w2 of each of the convex patterns 120 may be less than a width w3 of each of the micro semiconductor chips 140. In addition, the width w3 of the micro semiconductor chips 140 may be smaller than the width w1 of the recesses HO in which the micro semiconductor chips 140 are to be mounted. The width w3 of the micro semiconductor chips 140 may be smaller than or equal to 95%, 90%, or 80%, and greater than 50% of the width w1 of the recesses HO. To lower the surface energy of the interface between the convex patterns 120 and the micro semiconductor chips 140, the width w2 of each convex pattern 120 may be set to be, for example, 50% or less, 30% or less, or 10% or less of each micro semiconductor chip 140.

In addition, the space s between adjacent convex patterns 120 may be set to be less than the width w1 of each micro semiconductor chip 140. Even when the space s between adjacent convex patterns 120 is less than the width w1 of each micro semiconductor chip 140, there may be a case when both ends of each micro semiconductor chip 140 are each caught in the upper portion and the lower portion of the adjacent convex patterns 120, making it impossible for the micro semiconductor chip 140 to be moved toward the recess HO. To prevent such a phenomenon, a maximum value $s_c$ of the space s between adjacent convex patterns 120 may be set.

Thus, s, which is the space between adjacent convex patterns 120, may satisfy the following condition.

$$s \leq s_c = (w3-w2)/2$$

s, which is the space between the convex patterns 120, may satisfy the following condition in relation to the width w1 of the recess HO.

$$s < (w1-w2)/2$$

Such a requirement of the space s and widths w1, w3 and w3 is also applied to directions other than the illustrated direction. That is, w3 may be a width in any direction of the bottom surface of the micro semiconductor chip 140, w1 may be a width in any direction of the recess HO, and the width w2 and space s between the convex patterns 120 may be a width and a space in not only the X direction, as illustrated, but also in any direction in a plane perpendicular to the Z direction.

The space s between the convex patterns 120 may be set to be equal to or less than the maximum value $s_c$, 90% of $s_c$ or less, 80% of $s_c$ or less, or 50% of $s_c$ or less.

A height of the convex patterns 120 is not particularly limited, and may be set to be similar to, equal to, or less than a height of the micro semiconductor chips 140.

Figure 4:
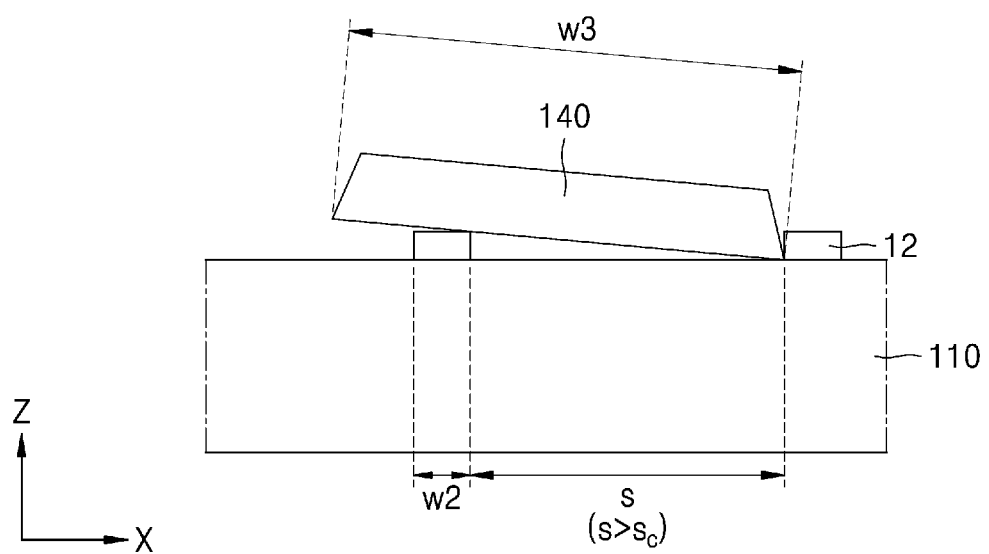
FIG. 4 is a conceptual view showing a space between uneven patterns provided on a transferring substrate according to a comparative example.

FIG. 4 is a conceptual view showing an example of inappropriate space between the convex patterns provided on the transferring substrate according to a comparative example.

When the space between convex patterns 12 does not satisfy the above condition and is greater than $s_c$, both ends of the micro semiconductor chip 140 may each be caught in the upper portion and lower portion of the adjacent convex patterns 12 and it may be difficult for the micro semiconductor chip 140 to be moved into the recess HO.

Figure 5A:
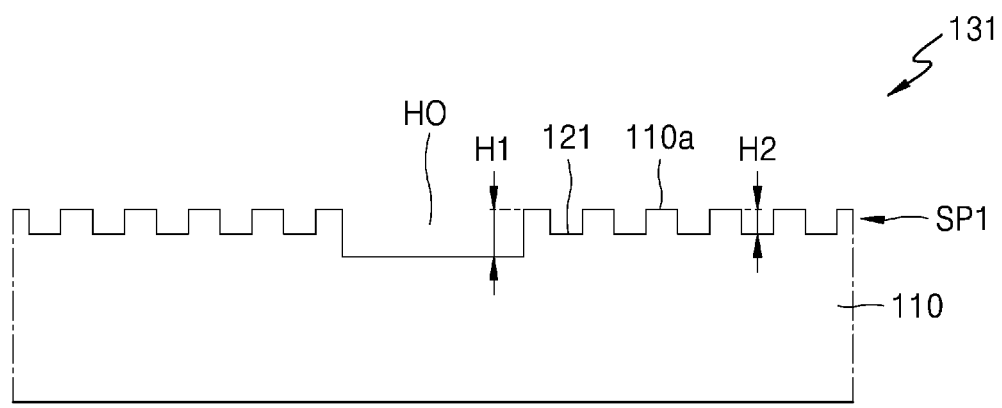
FIGS. 5A and 5B are each a schematic cross-sectional view illustrating a structure of a micro semiconductor chip transferring substrate according to another embodiment.
Figure 5B:
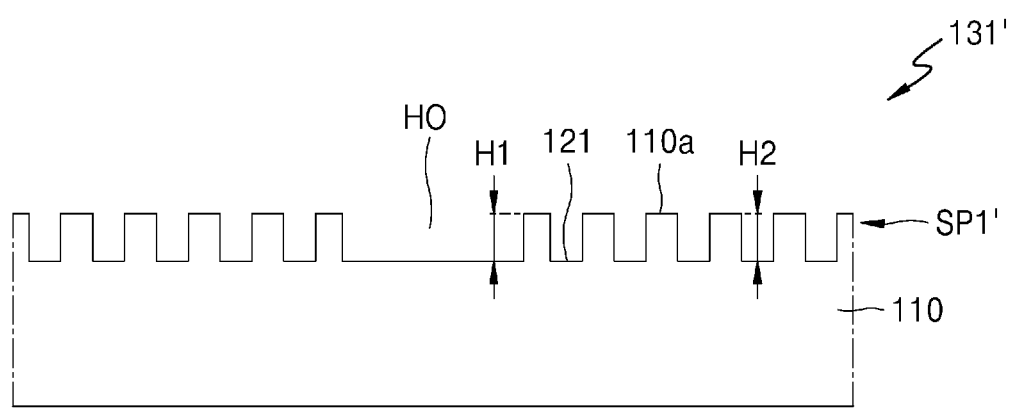

FIG. 5A and FIG. 5B are schematic cross-sectional views illustrating a structure of a micro semiconductor chip transferring substrate according to another embodiment.

The surface energy reduction pattern SP1 of the micro semiconductor chip transferring substrate 131 of the embodiment of FIG. 5A may include a plurality of concave patterns 121 recessed from the upper surface 110a of the mold 110. The depth H2 of the concave patterns 121 may be equal to or less than the depth H1 of the recesses HO. The recesses HO and the concave patterns 121 may be formed together when the mold 110 is manufactured.

In the surface energy reduction pattern SP1' of the micro semiconductor chip transferring substrate 131' of the embodiment of FIG. 5B, the depth H2 of the concave patterns 121 may be identical to the depth H1 of the recesses HO. In this case, a process in which the recesses HO and the concave patterns 121 are formed together when the mold 110 is manufactured may be easier.

Figure 6:
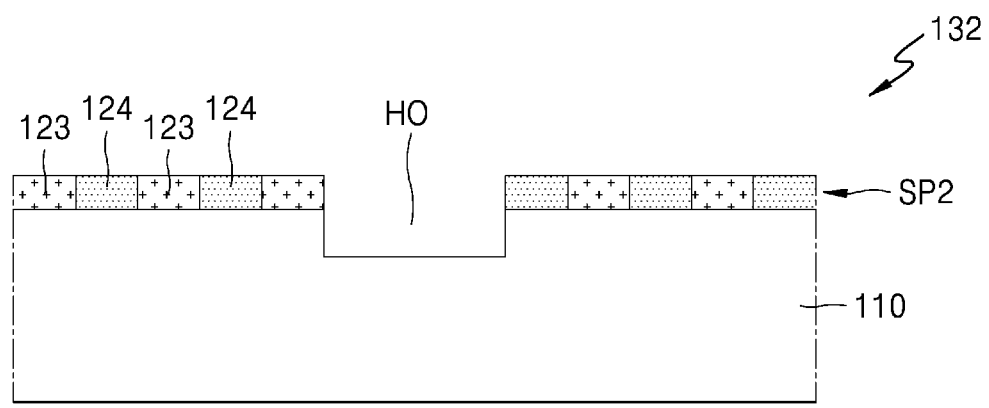
FIG. 6 is a schematic cross-sectional view illustrating a structure of a micro semiconductor chip transferring substrate according to another embodiment.

FIG. 6 is a schematic cross-sectional view illustrating a structure of a micro semiconductor chip transferring substrate according to another embodiment.

The surface energy reduction pattern SP2 of the micro semiconductor chip transferring substrate 132 of the present embodiment may include a plurality of convex patterns 123 protruded from the upper surface of the mold 110 and a filling pattern 124 filling area between the plurality of convex patterns 123. The convex patterns 124 may be formed with a different material from that of the convex patterns 123. The convex patterns 123 and the filling pattern 124 may be formed to have approximately the same height to thereby form a flat surface as a whole. Any one of the materials that form the convex patterns 123 and the filling pattern 124 may be a hydrophilic material and the other may be a hydrophobic material.

Figure 7:
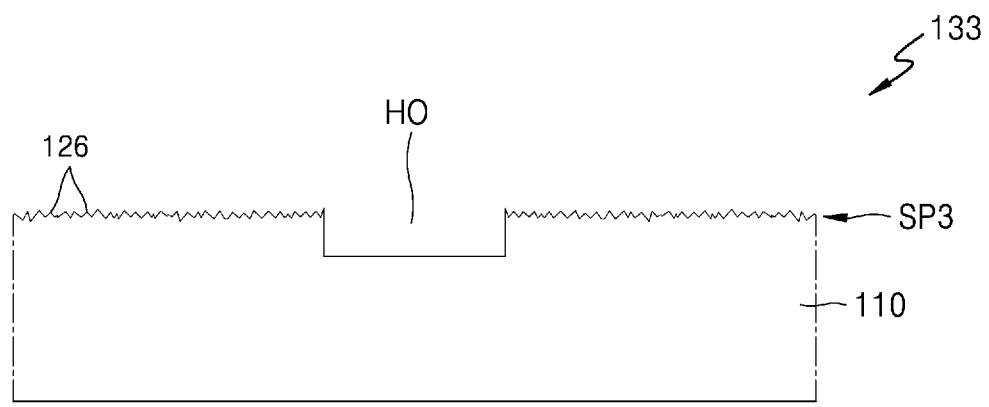
FIG. 7 is a cross-sectional view illustrating a schematic structure of a micro semiconductor chip transferring substrate according to another embodiment.

FIG. 7 is a cross-sectional view illustrating a schematic structure of a micro semiconductor chip transferring substrate according to another embodiment.

The surface energy reduction pattern SP3 of the micro semiconductor chip transferring substrate 133 according to an embodiment may include a plurality of convex patterns 126 formed by roughing the mold surface. Although the convex patterns 126 are illustrated to be integrated with the mold 110, one or more embodiments are not limited thereto, and after forming a metal layer on the mold 110, the convex patterns 126 may be formed by roughing the surface of the metal layer.

In the micro semiconductor chip transferring substrates 130, 131, 132, and 133 illustrated in FIGS. 1 to 7, the micro semiconductor chip may be arranged in the plurality of recesses HO to form a display transferring structure to be applied to a display device.

Figure 8:
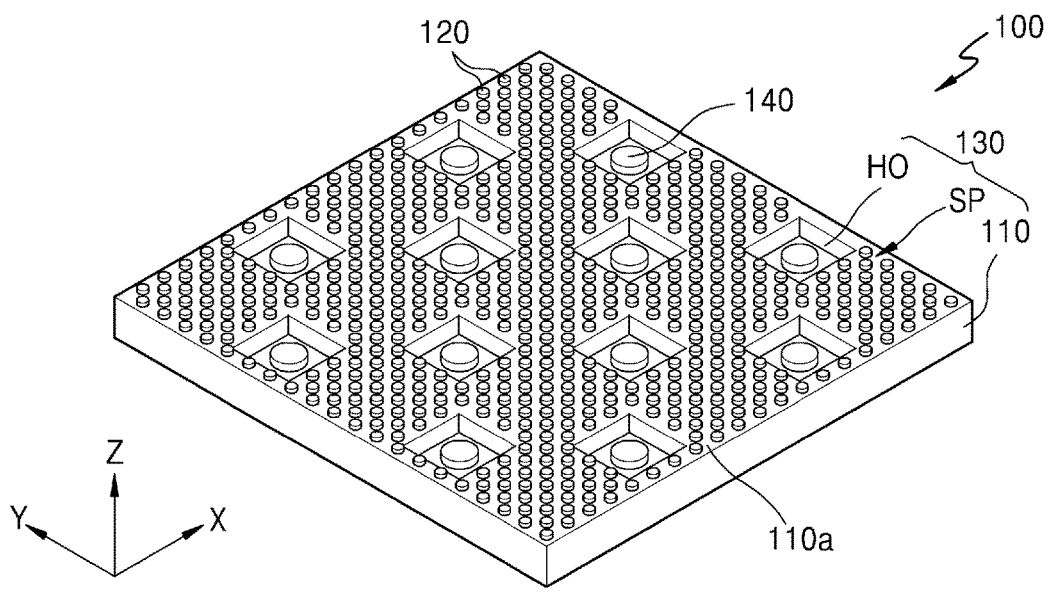
FIG. 8 is a schematic perspective view of a display transferring structure according to an embodiment.
Figure 9:
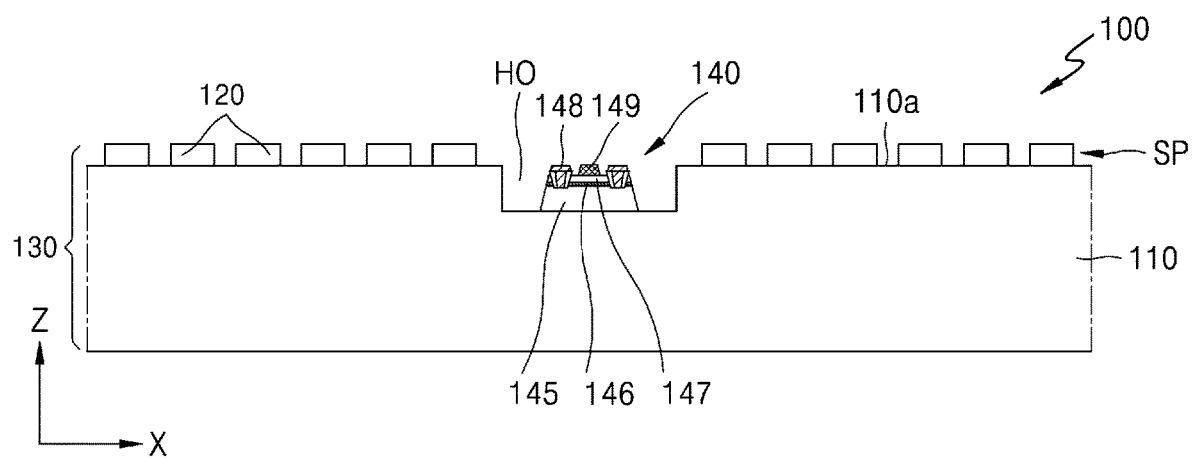
FIG. 9 is an enlarged cross-sectional view of a part of FIG. 8.

FIG. 8 is a schematic perspective view of a display transferring structure according to an embodiment, and FIG. 9 is an enlarged cross-sectional view of a part of FIG. 8.

The display transferring structure 100 may include a transferring substrate 130 including a mold 110 in which a plurality of recesses HO are formed and a surface energy reduction pattern SP formed on the upper surface of the mold 119, and micro semiconductor chips 140 arranged inside the recesses HO.

The micro semiconductor chips 140 may include various semiconductor chips having micro sizes, and micro sizes may be 1,000 μm or less, 200 μm or less, 100 μm or less, or 50 μm or less. The micro semiconductor chips 140 may include, for example, a light-emitting diode (LED), a complementary metal-oxide semiconductor (CMOS), a CMOS image sensor (CIS), a vertical-cavity surface-emitting laser (VCSEL), a photodiode (PD), a memory device, or a two-dimensional (2D) material device. The 2D material may be a graphene or carbon nanotubes (CNTs). In the following description, the micro semiconductor chips 140 may be described as LED chips, but are not limited thereto.

Referring to the specific structure of the micro semiconductor chips 140 shown in FIG. 9 as an example, the micro semiconductor chips 140 may include an n-type semiconductor layer 145, an active layer 146, or a p-type semiconductor layer 147. The n-type semiconductor layer 145 may include n-type GaN and the p-type semiconductor layer 147 may include p-type GaN, but are not limited thereto. The active layer 146 may have, for example, a quantum well structure or a multi-quantum well structure. A first electrode 148 and a second electrode 149 may be arranged on the micro semiconductor chips 140. The first electrode 148 may be electrically connected to the n-type semiconductor layer 145, and the second electrode 149 may be electrically connected to the p-type semiconductor layer 147. The micro semiconductor chips 140 may have a horizontal electrode structure, and thus, as illustrated, the first electrode 148 and the second electrode 149 may be arranged in a same side of the semiconductor chip 140. The specific forms of the micro semiconductor chips 140 are examples and are not limited thereto.

A cross-sectional shape of the micro semiconductor chips 140 is illustrated as a circle, but is not limited thereto, and may be, for example, rectangular.

Figure 10:
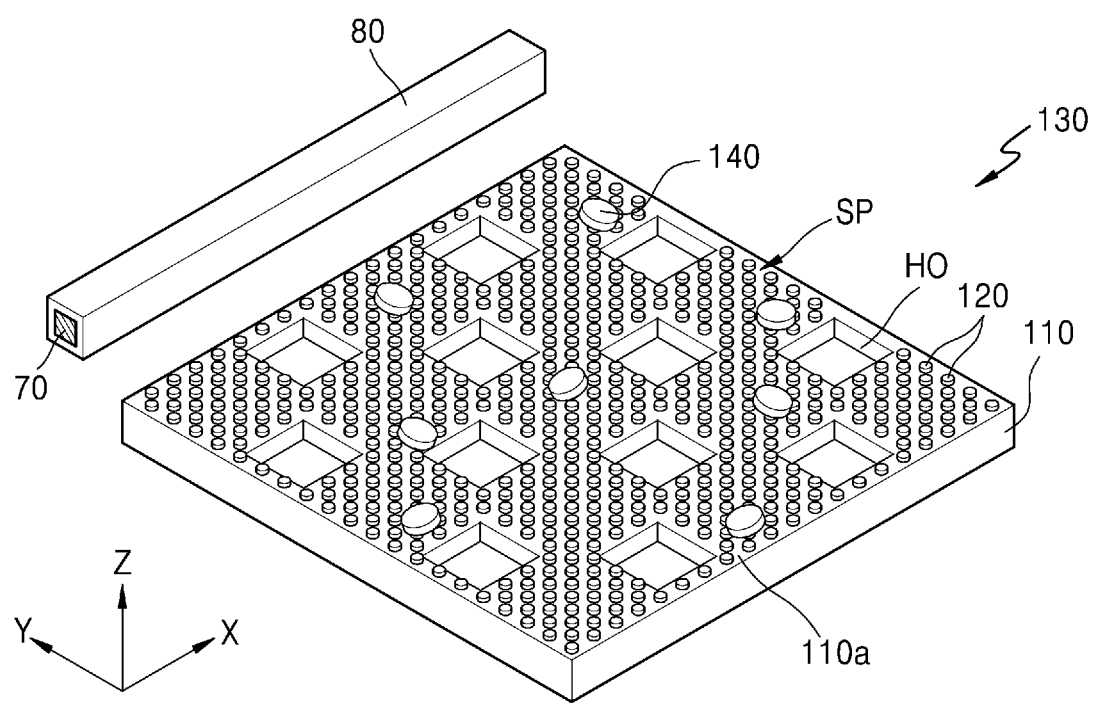
FIG. 10 is a diagram for explaining a process of forming the display transferring structure of FIG. 8.

FIG. 10 is a diagram for explaining a process of forming the display transferring structure of FIG. 8.

FIG. 10 shows a state wherein the plurality of micro semiconductor chips 140 are provided on the transferring substrate 130, which includes the mold 110 including the recesses HO and the convex patterns 120 formed on the outer surface 110a of the mold 110. The plurality of micro semiconductor chips 140 may be directly sprayed on the transferring substrate 130 after supplying a predetermined liquid to the recesses HO of the transferring substrate 130, or may be supplied on the transferring substrate 130 while being included in a predetermined suspension.

Liquid supplied to the recesses HO may be any type of liquid unless it corrodes or damages the micro semiconductor chips 140, and various methods such as spraying, dispensing, inkjet dotting, and flowing liquid to the transferring substrate 130 may be used. Liquid may include, for example, at least one of or multiple combinations of water, ethanol, alcohol, polyol, ketone, halocarbon, acetone, flux, and an organic solvent. An organic solvent may include, for example, isopropyl alcohol (IPA).

The plurality of micro semiconductor chips 140 may be directly sprayed on the transferring substrate 130 without other liquids, or may be supplied on the transferring substrate 130 while being included in a suspension.

An absorbent material 80 may scan the transferring substrate 130. By the scanning, the absorbent material 80 may move the micro semiconductor chips 140 into the recesses HO while being in contact with the transferring substrate 130 and passing through the plurality of recesses HO, and may absorb liquid in the recesses HO. A material capable of absorbing liquid is sufficient for an absorbent material 80, and the form or structure of the absorbent material 80 is not limited. The absorbent material 80 may include, for example, fabric, tissue, polyester fibers, paper, wipers, and the like. Although the absorbent material 80 may be used alone without other auxiliary equipment, one or more embodiments are not limited thereto, and may be coupled to a support 70 for convenient scanning of the transferring substrate 130. The support 70 may have various forms or structures suitable for scanning the transferring substrate 130. The support 70 may have the form of, for example, a load, a blade, a plate, or a wiper. The absorbent material 80 may be provided on any one surface of the support 70 or may be wrapped around the support 70. The cross-sectional shape of the absorbent material 80 and the support 70 may not only be limited to a square but may also be a circle.

The absorbent material 80 may scan the transferring substrate 130 while pressing at an appropriate pressure. Scanning may be performed by the absorbent material 80 through various methods such as a sliding method, a rotating method, a translating movement method, a reciprocating movement method, a rolling method, a spinning method, and/or a rubbing method, and may include both regular and irregular methods. Scanning may be performed by moving the transferring substrate 130 instead of the absorbent material 80, and scanning of the transferring substrate 130 may also be performed by methods such as sliding, rotating, translational reciprocating, rolling, spinning, and/or rubbing.

Scanning may also be performed by a cooperation of the absorbent material 80 and the transferring substrate 130.

Figure 11:
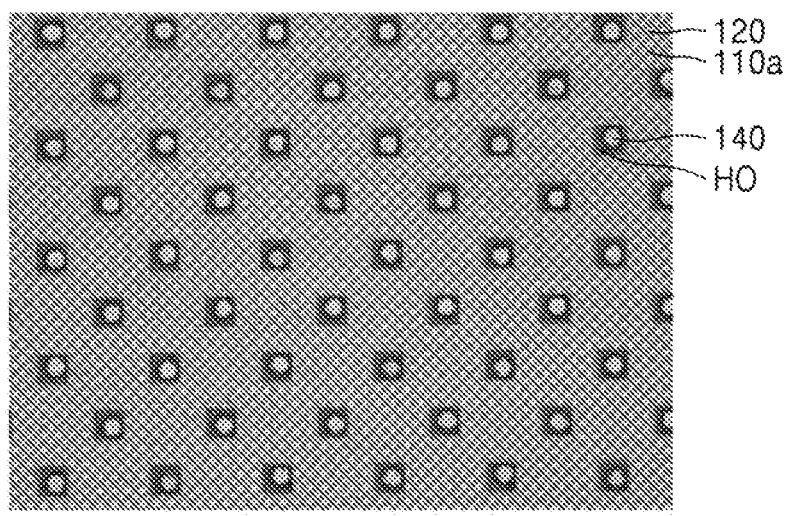
FIG. 11 is a micrograph showing a manufactured display transferring structure of FIG. 8.

FIG. 11 is a micrograph showing the manufactured display transferring structure of FIG. 8.

It can be seen that the micro semiconductor chips 140 are only inside the recesses HO and do not remain in other positions. Such a manufacturing process was performed by changing the occupancy of the convex patterns 120, that is, the fill factor, which is the ratio of the area occupied by the convex patterns 120 relative to the total area of the outer surface 110a connected to the recesses HO, to 25%, 45%, and 71%. The convex patterns 120 prevents the micro semiconductor chips 140 from being pressed in another position, thereby improving sliding and spreading efficiency. As a result, a clean state of 99.9% or more are shown at positions excluding the recesses HO.

Figure 12:
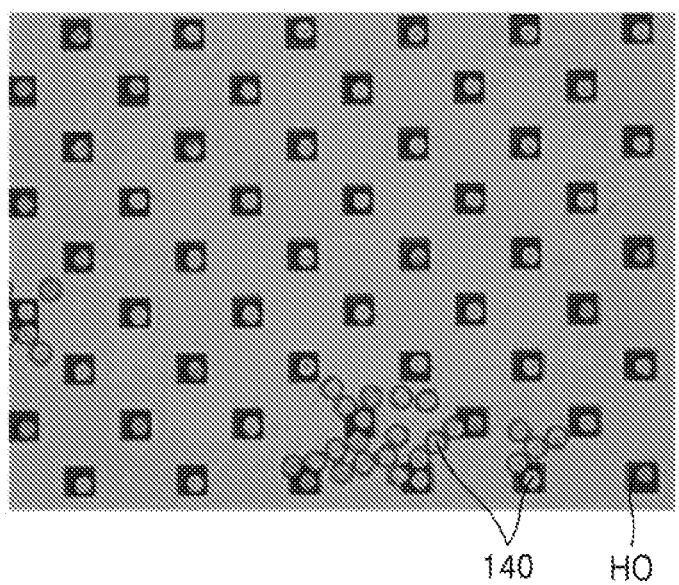
FIG. 12 is a micrograph showing a manufactured display transferring structure according to a comparative example.

FIG. 12 is a micrograph showing a manufactured display transferring structure according to a comparative example.

In the display transferring structure according to a comparative example, which was manufactured using a transferring substrate 130 not including the convex patterns 120, it may be seen that the plurality of micro semiconductor chips 140 remain on the surface of the transferring substrate 130, not the recesses HO.

In the display transferring structure 100 described above, although the mold 110 and the convex patterns 120 in the transferring substrate 130 were exemplified to include different materials, the mold 100 and the convex patterns 120 may include the same material and may be integrated.

Figure 13:
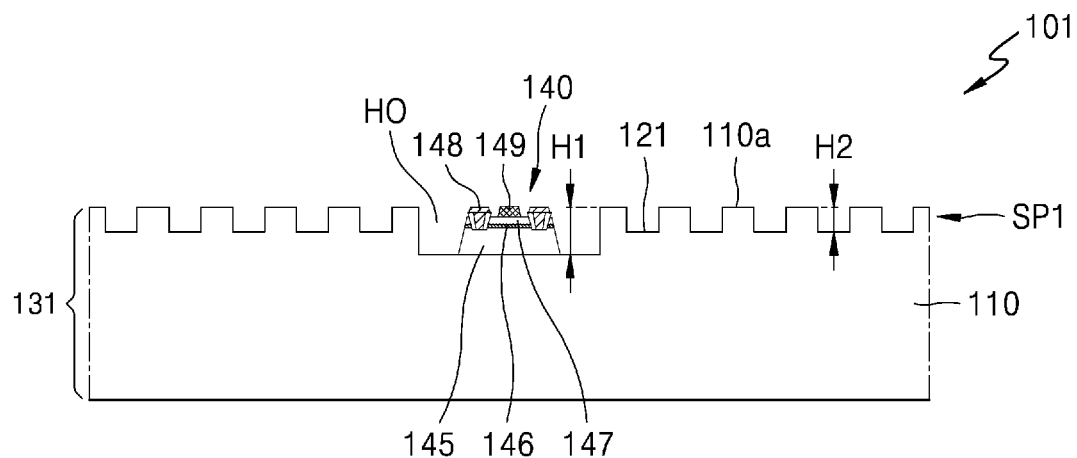
FIG. 13 is a schematic cross-sectional view of a display transferring structure according to another embodiment.

FIG. 13 is a schematic cross-sectional view of a display transferring structure according to another embodiment.

A display transferring structure 101 may include a transferring substrate 131 and a micro semiconductor chip 140 arranged in a recess HO of the transferring substrate 131. The transferring substrate 131 may be substantially similar to the transferring substrate illustrated in FIG. 5A. The transferring substrate 131 may be changed to the transferring substrate 131' illustrated in FIG. 5B.

Figure 14:
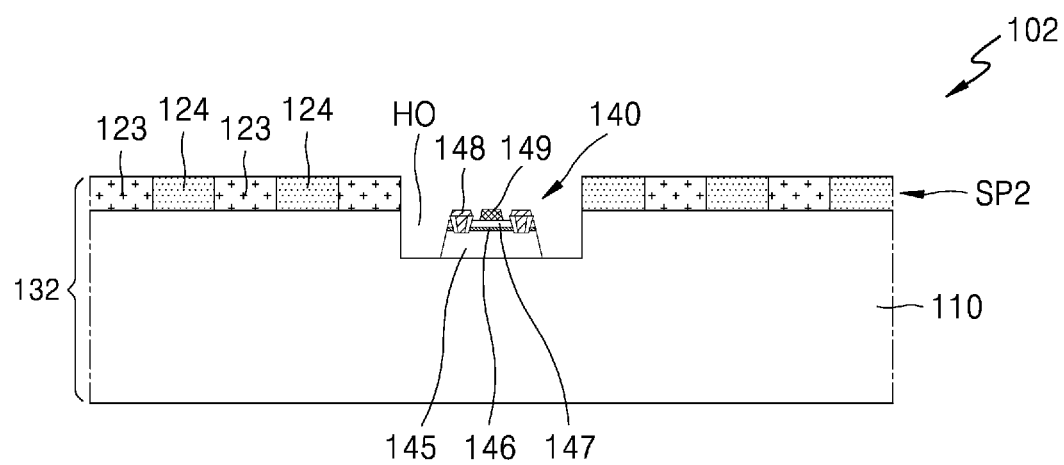
FIG. 14 is a schematic cross-sectional view of a display transferring structure according to another embodiment.

FIG. 14 is a schematic cross-sectional view of a display transferring structure according to another embodiment.

The display transferring structure 102 of the present embodiment may have a structure in which a micro semiconductor chip 140 is arranged in a recess HO of the transferring substrate 132 illustrated in FIG. 6.

Figure 15:
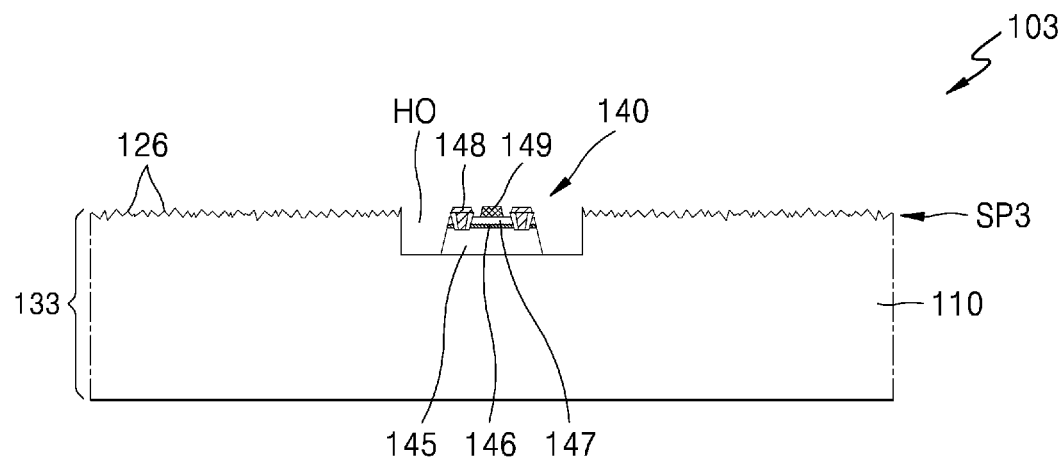
FIG. 15 is a schematic cross-sectional view of a display transferring structure according to another embodiment.

FIG. 15 is a schematic cross-sectional view of a display transferring structure according to another embodiment.

A display transferring structure 103 according to an embodiment may have a structure in which a micro semiconductor chip 140 is arranged in a recess HO of the transferring substrate 133 illustrated in FIG. 7.

The display transferring structures 100, 101, 102, and 103 described above may be applied to a display device using the micro semiconductor chips 140. The plurality of micro semiconductor chips 140 provided in the display transferring structures 100, 101, 102, and 103 may include a plurality of LED chips emitting red light (R), green light (G), and blue light (B), or only a plurality of LED chips emitting blue light (B). Such display transferring structures 100, 101, 102, and 103 may be applied to a display device wherein the plurality of micro semiconductor chips 140 operate as individual pixels, for example, an RGB self-emissive micro LED TV. In this case, the display transferring structures 100, 101, 102, and 103 may be used as a display device as a whole, or the micro semiconductor chips 140 provided on the display transferring structures 100, 101, 102, and 103 may be bonding transferred (eutectic bonding) to the thin-film transistor (TFT) substrate.

The display transferring structures 100, 101, 102, and 103 may each be used directly as a display substrate and constitute the display device. Examples of FIGS. 12 to 19 each exemplify a display transferring structure further including an additional structure so that the display transferring structure may be used as a display substrate.

Figure 16:
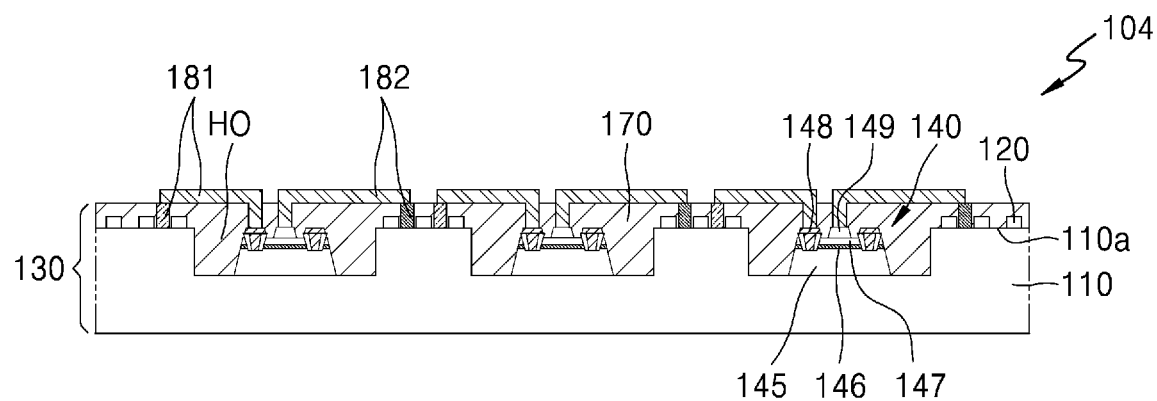
FIG. 16 is a schematic cross-sectional view of a display transferring structure according to another embodiment.

FIG. 16 is a schematic cross-sectional view of a display transferring structure according to another embodiment.

A display transferring structure 104 of the present embodiment may have a form that further includes an additional material layer in the display transferring structure 100 of FIG. 1.

The display transferring structure 104 may further include an insulating layer 170 formed inside recesses HO, and circuit elements 181 and 182 connected to first electrodes 148 and second electrodes 149 of micro semiconductor chips 140. Circuit elements 181 and 182 may constitute a part of a driving circuit which drives the micro semiconductor chips 140.

Figure 17:
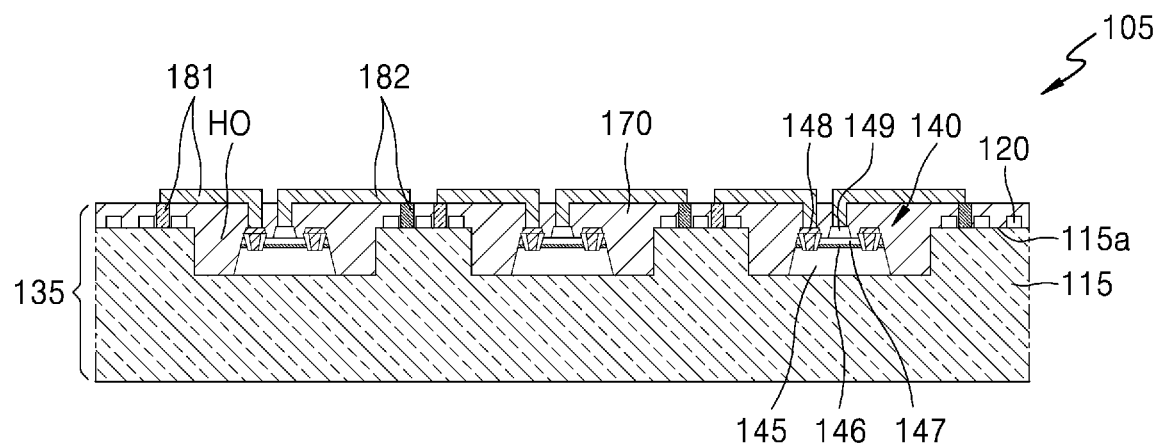
FIG. 17 is a schematic cross-sectional view of a display transferring structure according to another embodiment.

FIG. 17 is a schematic cross-sectional view of a display transferring structure according to another embodiment.

A display transferring structure 105 of the present embodiment differs from the display transferring structure 104 previously described in that a circuit board 115 including a driving circuit which drives micro semiconductor chips 140 is used as a transferring substrate 135. Circuit elements such as a driving transistor, a switch transistor, and a capacitor may be provided inside the circuit board 115. Recesses HO may be formed in the circuit board 115, and a plurality of convex patterns 120 may be provided on an outer surface 115a of the circuit board 115 including the recesses HO, and thus, micro semiconductor chips 140 may be aligned inside the recesses HO by a wet alignment method. Therefore, the additional process is minimized and the display transferring structure 105 may be used as the display device.

Figure 18:
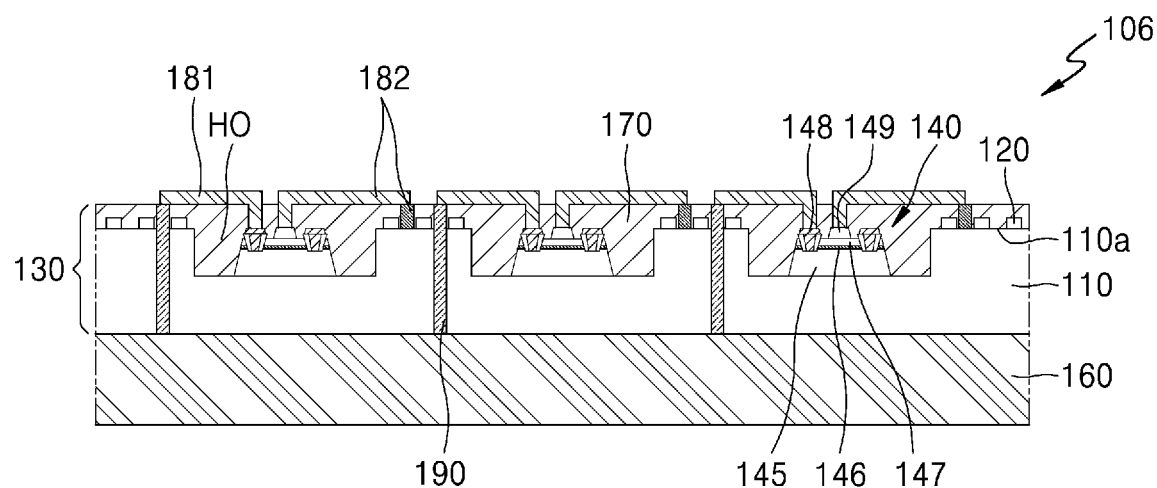
FIG. 18 is a schematic cross-sectional view of a display transferring structure according to another embodiment.

FIG. 18 is a schematic cross-sectional view of the display transferring structure according to another embodiment.

A display transferring structure 106 of the present embodiment may include a circuit board 160 arranged under a transferring substrate 130. Circuit elements such as a driving transistor, a switch transistor, and a capacitor may be provided in the circuit board 160, and the circuit elements of the circuit board 160 may be electrically connected with micro semiconductor chips 140 through conductive vias 190 that penetrate a mold 110.

The display transferring structures 104, 105, and 106 illustrated in FIGS. 16 to 18 exemplify that additional structures are included in the display transferring structure 100 of FIG. 8, but the examples are not limited thereto, and may be changed to structures in which the additional structures are provided on the display transferring structures 101, 102, and 103 exemplified in FIGS. 13 to 15.

Figure 19:
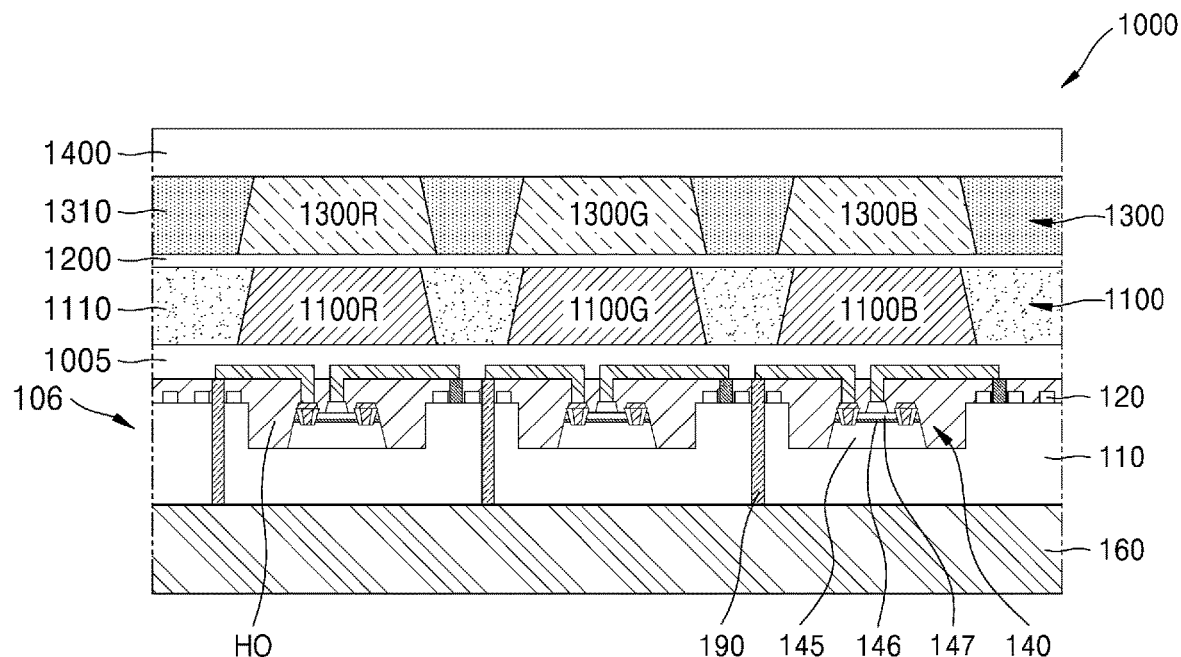
FIG. 19 is a schematic cross-sectional view of a display device according to an embodiment.

FIG. 19 is a schematic cross-sectional view of the display device according to an embodiment.

A display device 1000 may include a display transferring structure 106, and a color conversion layer 1100 arranged on the display transferring structure 106. The display transferring structure 106 may include a mold 110 including recesses HO and convex patterns 120 formed on the surface of the mold 110 and micro semiconductor chips 140 arranged in recesses HO.

Although the display transferring structure 106 is illustrated as exemplified in FIG. 18, one or more embodiments are not limited thereto, and may be changed to the display transferring structure 104 of FIG. 16, the display transferring structure 105 of FIG. 17, or forms changed therefrom.

A passivation layer 1005 including an insulating material may be arranged on the display transferring structure 106, and the color conversion layer 1100 may be arranged on the passivation layer 1005.

The color conversion layer 1100 may include a first color conversion layer 1100B configured to convert light from the micro semiconductor chips 140 to first color light, a second color conversion layer 1100G configured to convert light to second color light, and a third color conversion layer 1100R configured to convert light to third color light. The first color light may be, for example, blue light, the second color light may be, for example, green light, and the third color light may be, for example, red light. The first color conversion layer 1100B, the second color conversion layer 1100G, and the third color conversion layer 1100R may be apart from each other with a partition wall 1110 therebetween, and each of the layers may be arranged to face the micro semiconductor chips 140.

When the micro semiconductor chips 140 emit blue light, the first color conversion layer 1100B may include a resin which transmits blue light. The second color conversion layer 1100G may convert blue light emitted from the micro semiconductor chips 140 to emit green light. The second color conversion layer 1100G may include: quantum dots (QDs) excited by blue light from the micro semiconductor chips 140 to emit green light; or phosphor. The third color conversion layer 1100R may convert blue light emitted from the micro semiconductor chips 140 to emit red light. The third color conversion layer 1100R may include: QDs excited by blue light emitted from the micro semiconductor chips 140 to emit red light; or phosphor.

The QDs included in the second color conversion layer 1100G and the third color conversion layer 1100R may have a core-shell structure having a core portion and a shell portion, or may have a particle structure without a shell. The core-shell structure may be a single-shell structure or a multi-shell structure, for example, a double-shell structure. The QD may include a group II-VI semiconductor, a group III-V semiconductor, a group IV-VI semiconductor, a group IV semiconductor, and/or a graphene QD. The QD may, for example, include Cd, Se, Zn, S and/or InP, and each of the QDs may have a diameter of less than tens of nm or less, for example, about 10 nm or less. The QDs included in the second color conversion layer 1100G and the third color conversion layer 1100R may have different sizes.

A capping layer 1200 may be arranged on the color conversion layer 1100, and a color filter layer 1300 may be arranged on the capping layer 1200. The color filter layer 1300 may include a first filter 1300B, a second filter 1300G, and a third filter 1300R apart from each other with a black matrix 1310 therebetween. The first filter 1300B, the second filter 1300G, and the third filter 1300R may be arranged to respectively face the first color conversion layer 1100B, the second color conversion layer 1100G, and the third color conversion layer 1100R. The first filter 1300B, the second filter 1300G, and the third filter 1300R may each transmit blue light, green light, and red light, and absorb light of other colors. The color filter layer 1300 may be omitted. When the color filter layer 1300 is provided, light emitted without color conversion from the second color conversion layer 1100G, that is, light other than green light, or light emitted without color conversion from the third color conversion layer 1100R, that is, light other than red light, may each be filtered in the second filter 1300G and the third filter 1300R, thereby increasing color purity.

A protective substrate 1400 made of transparent material may be arranged on the color conversion layer 1100.

Unlike in the description of FIGS. 16 to 19, the micro semiconductor chips 140 provided on the display transferring structures 100, 101, 102, and 103 may be transferred to a display substrate and then applied to a display device.

Figure 20:
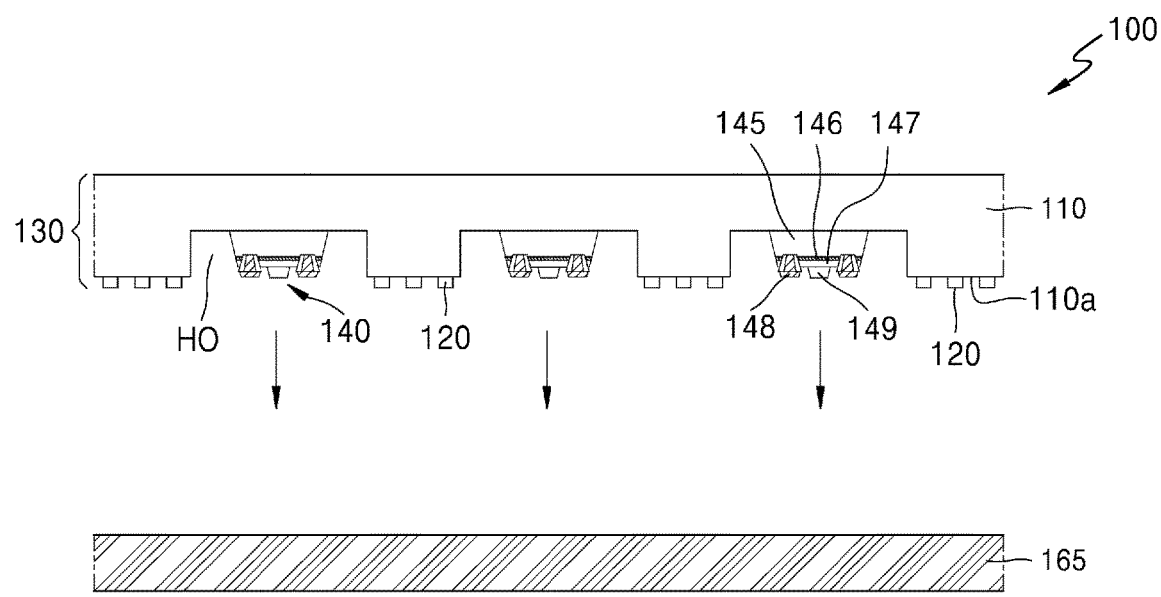
FIG. 20 shows micro semiconductor chips which are provided on a display transferring structure being transferred to a display substrate.

FIG. 20 shows the micro semiconductor chips provided on the display transferring structure being transferred to a display substrate.

As illustrated, the display transferring structure 100 may act as a transferring mold for transferring micro semiconductor chips 140 to another position. The micro semiconductor chips 140 may be transferred by bonding to a display substrate 165 including a driving circuit such as a TFT that drives the micro semiconductor chips 140. Because the micro semiconductor chips 140 are appropriately positioned inside recesses HO through convex patterns 120 formed on an outer surface 110a of a mold 110 including the recesses HO, the micro semiconductor chips 140 may be transferred appropriately on a predetermined position of the display substrate 165. After the micro semiconductor chips 140 are bonded and transferred on the display substrate 165, the display device may be completed through an additional process. Although the display transferring structure 100 is exemplified in FIG. 20, the display transferring structures 101, 102, and 103 may be used as transferring molds. By using the display transferring structures 100, 101, 102, and 103, the manufacturing yield of the display device may be improved.

Figure 21:
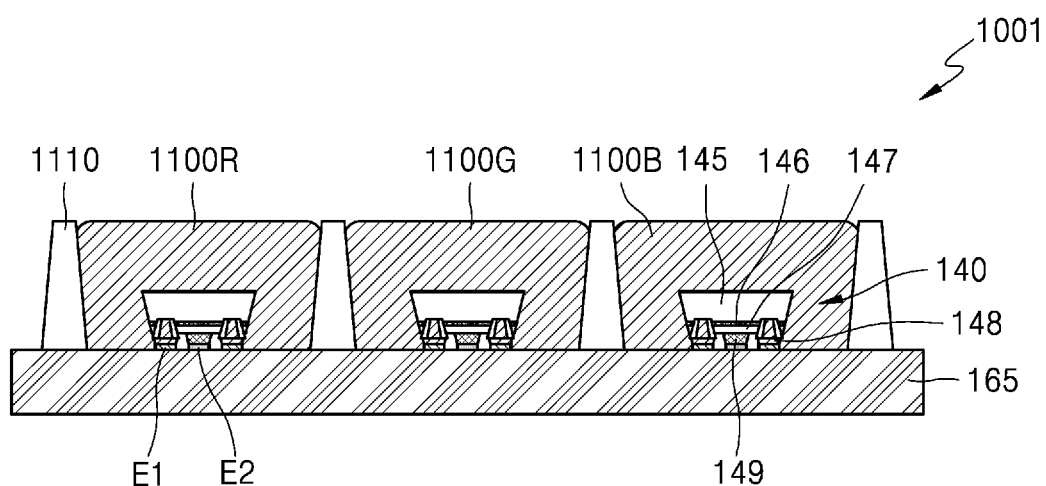
FIG. 21 is a schematic cross-sectional view of a display device according to another embodiment.

FIG. 21 is a schematic cross-sectional view of a display device according to another embodiment.

A display device 1001 according to an example may include a display substrate 165 including a driving circuit, and the micro semiconductor chips 140 transferred from the display transferring structure 100 to the display substrate 165 as illustrated in FIG. 20.

The micro semiconductor chips 140 may have a horizontal electrode structure as described above, and the first electrode 148 and the second electrode 149 may be arranged in a same side of the micro semiconductor chip 140.

The display substrate 165 may include a driving circuit including a transistor, capacitor, etc., and a first circuit E1 and a second circuit E2 which are connected to the driving circuit may be formed on the display device 165. When the micro semiconductor chips 140 are transferred, the first electrode 148 may be connected to the first circuit E1, and the second electrode 149 may be connected to the second circuit E2.

A first color conversion layer 1100B, a second color conversion layer 1100G, and a third color conversion layer 1100R may be arranged on the micro semiconductor chips 140. The first color conversion layer 1100B, the second color conversion layer 1100G, and the third color conversion layer 1100R may be layers forming colors by converting wavelengths of lights generated from the micro semiconductor chips 140, and may be substantially similar to the color conversion layers of FIG. 19. Although not shown in the drawing, the display device 1001 may further include a color filter layer and a protective substrate as in the display device 1000 of FIG. 19.

Figure 22:
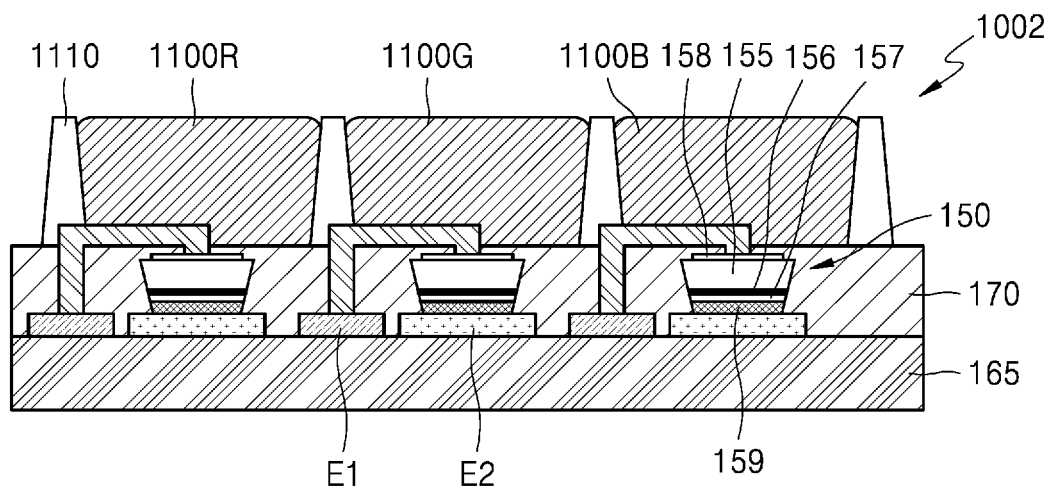
FIG. 22 is a schematic cross-sectional view of a display device according to another embodiment.

FIG. 22 is a schematic cross-sectional view of a display device according to another embodiment.

Micro semiconductor chips 150 in a display device 1002 of the present embodiment may have a vertical electrode structure. The micro semiconductor chips 150 may include an n-type semiconductor layer 155, an active layer 156, or a p-type semiconductor layer 157. A first electrode 158 and a second electrode 159 may be arranged on and under the micro semiconductor chip 150. The first electrode 158 may be electrically connected to the n-type semiconductor layer 155, and the second electrode 159 may be electrically connected to the p-type semiconductor layer 157. The micro semiconductor chips 140 provided on the display transferring structure 100 exemplified in the transferring process of FIG. 20 may be changed to the micro semiconductor chips 150, and the micro semiconductor chips 150 may be transferred to the display substrate 165 through the display transferring structure 100. When the micro semiconductor chips 150 are transferred, the first electrode 158 may be connected to a first circuit E1, and the second electrode 159 may be connected to a second circuit E2. An insulating layer 170 may be provided on a display substrate 165 including a driving circuit, and the first electrode 158 and the first circuit E1 may be connected through a conductive via passing through the insulating layer 170.

First, second, and third color conversion layers 1100B, 1100G, and 110R, each facing each of the plurality of micro semiconductor chips 140, may be provided on the plurality of micro semiconductor chips 140. The first, second, and third color conversion layers 1100B, 1100G, and 110R are substantially similar to the color conversion layers of FIG. 19. Although not shown in the drawing, the display device 1002 may further include a color filter layer and a protective substrate as in the display device 1000 of FIG. 19.

Figure 23:
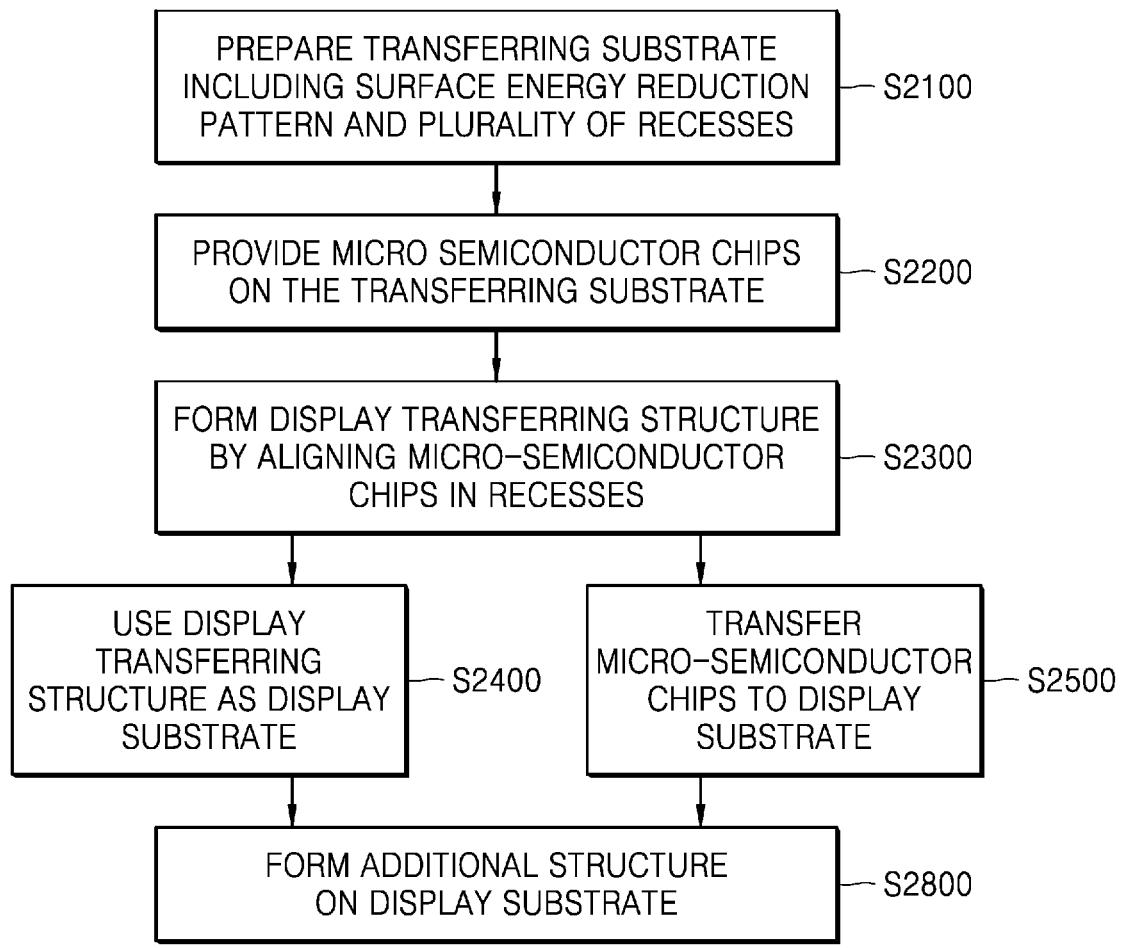
FIG. 23 is a flowchart schematically illustrating a method of manufacturing a display device according to an embodiment.
Figure 24:
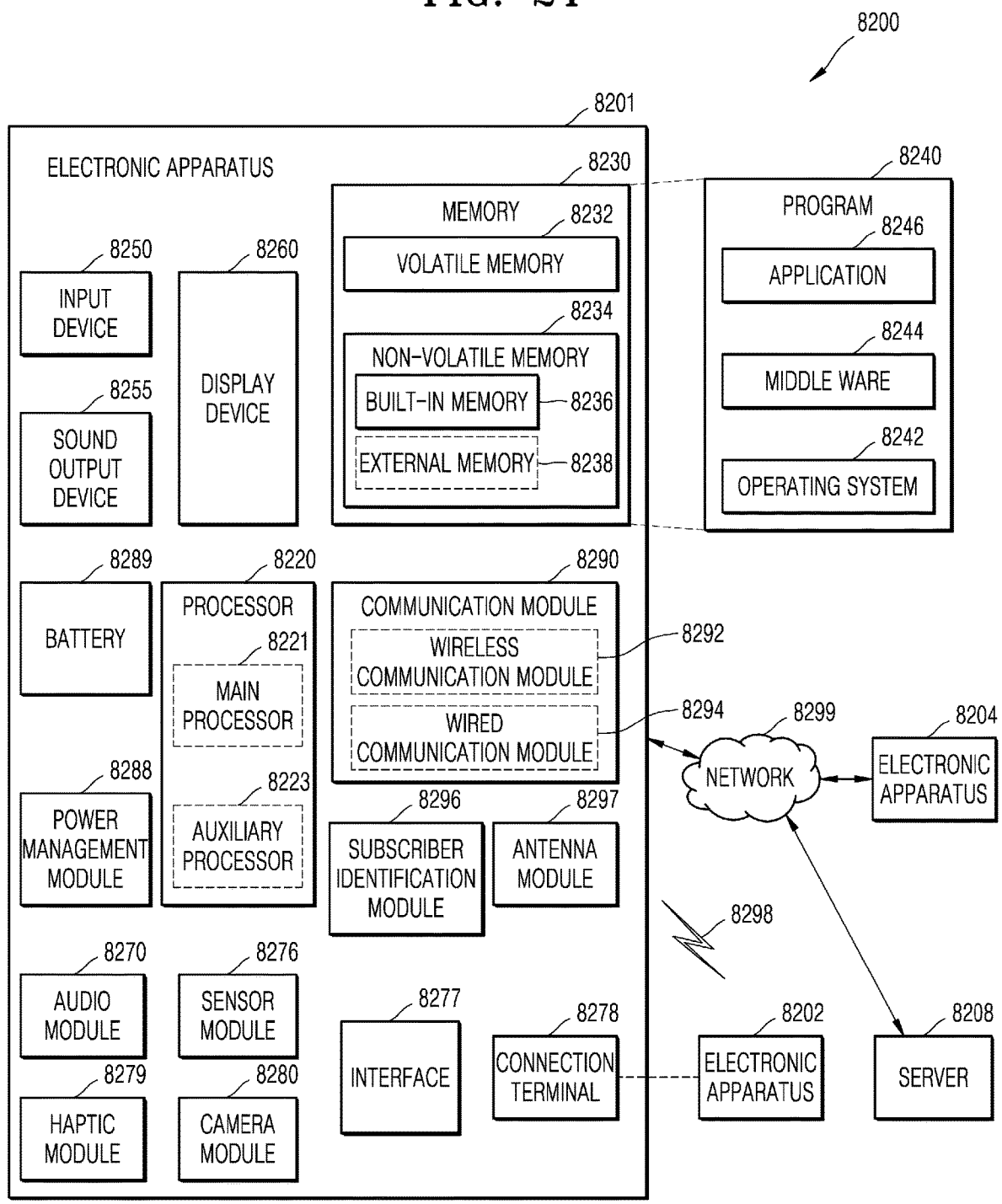
FIG. 24 is a schematic block diagram showing an electronic apparatus according to an embodiment.

FIG. 23 is a flowchart schematically illustrating a method of manufacturing a display device according to an embodiment.

First, a micro semiconductor chip transferring substrate including a surface energy reduction pattern and a plurality of recesses may be prepared, as S2100. For example, the micro semiconductor chip transferring substrates 130, 131, 132, and 133 described in FIGS. 1 to 7 or any structure modified therefrom may be used.

Then, a plurality of micro semiconductor chips may be provided on the prepared micro semiconductor chip transferring substrate, in a step S2200, and a display transferring structure may be formed by aligning the micro semiconductor chips in the recesses, in a step S2300. The FSA method as described in FIG. 10 may be used. The micro semiconductor chips may easily move into the recesses without sticking to the upper surface of a mold by the surface energy reduction pattern provided on the micro semiconductor chip transferring substrate. The display transferring structures 100, 101, 102, and 103 described in FIGS. 8 to 15, or any structure modified therefrom may be formed.

The manufactured display transferring structure may be directly used as a display substrate, in a step S2400, or a process for forming an additional structure may be performed, in a step S2500. When the display transferring structure is directly used as the display substrate, a driving circuit may be provided on the micro semiconductor chip transferring substrate in advance. After the micro semiconductor chips are aligned on the micro semiconductor chip transferring substrate to form a display transferring structure, the display transferring structure may be connected to a driving circuit substrate. Connecting the micro semiconductor chips to the driving circuit and forming a passivation and color conversion layer may be further performed.

The micro semiconductor chips may be transferred to a separate display substrate provided with a driving circuit, in a step S2500. Such a method is similar to that described in FIG. 20. An additional structure may further be formed on the display substrate onto which the micro semiconductor chips are transferred, in a step S2800. For example, connecting the micro semiconductor chips to the driving circuit and forming a passivation and color conversion layer may be further performed.

According to the operations described above, the display devices 1000, 1001, and 1002 of FIGS. 19, 21, and 22 may be manufactured. FIG. 16 is a schematic block diagram showing an electronic apparatus according to an embodiment.

Referring to FIG. 16, an electronic apparatus 8201 may be provided in a network environment 8200. In the network environment 8200, the electronic apparatus 8201 may communicate with another electronic apparatus 8202 through a first network 8298 (near-field communication, etc.) or may communicate with another electronic apparatus 8204 and/or server 8208 through a second network 8299 (far-field communication). The electronic apparatus 8201 may communicate with the electronic apparatus 8204 through the server 8208. The electronic apparatus 8201 may include a processor 8220, a memory 8230, an input device 8250, a sound output device 8255, a display device 8260, and audio module 8270, a sensor module 8276, an interface 8277, a haptic module 8279, a camera module 8280, a power management module 8288, a battery 8289, a communication module 8290, a subscriber identity module 8296, and/or an antenna module 8297. In the electronic apparatus 8201, some of these components may be excluded, or other components may be added. Some of these components may be implemented as one integrated circuit. For example, the sensor module 8276 (a fingerprint sensor, an iris sensor, an illuminance sensor, etc.) may be embedded in the display device 8260 (display, etc.).

The processor 8220 may execute software (a program 8240) to control one of the electronic apparatuses 8201 connected to the processor 8220 or a plurality of other components (hardware, software components, etc.), and various data processing or operations may be performed. As part of data processing or operations, the processor 8220 may load the commands and/or data received from other components (the sensor module 8276, the communication module 8290, etc.) to a volatile memory 8232, process the commands and/or data stored in the volatile memory 8232, and store the resulting data in a non-volatile memory 8234. The processor 8220 may include a main processor 8221 (a central processing unit, an application processor, etc.), and an auxiliary processor 8223 (a graphics processing device, an image signal processor, a sensor hub processor, a communication processor, etc.) that may be used independently or together with the main processor 8221. The auxiliary processor 8223 may use less power than the main processor 8221, and may perform a specialized function.

The auxiliary processor 8223 may control the function and/or status related to part of the components of the electronic apparatus 8201 instead of the main processor 8221 when the main processor 8221 is in an inactive state (sleep state), or together with the main processor 8221 when the main processor 8221 is in an active state (application execution state). The auxiliary processor 8223 (the image signal processor, the communication processor, etc.) may be implemented as part of another functionally related component (the camera module 8280, the communication module 8290, etc.).

The memory 8230 may store various data required by the components (the processor 8220, the sensor module 8276) of the electronic apparatus 8201. The data may include, for example, the software (the program 8240, etc.), and input data and/or output data regarding commands related thereto.

The memory 8230 may include the volatile memory 8232 and/or the non-volatile memory 8234.

The program 8240 may be stored in the memory 8230 as software, and may include an operating system 8242, middleware 8244, and/or an application 8246.

The input apparatus 8250 may receive commands and/or data to be used in the components (the processor 8220, etc.) of the electronic apparatus 8201 from outside (the user, etc.) the electronic apparatus 8201. The input apparatus 8250 may include a remote controller, a microphone, a mouse, a keyboard, and/or a digital pen (stylus pen).

The sound output apparatus 8255 may output the sound signal to the outside of the electronic apparatus 8201. The sound output apparatus 8255 may include a speaker and/or a receiver. The speaker may be used for general purposes such as multimedia playing or record playing, and the receiver may be used for receiving an incoming call. The receiver may be incorporated as a part of the speaker or implemented as an independent separate apparatus.

The display device 8260 may visually provide information to the outside of the electronic apparatus 8201. The display device 8260 may include a display, a hologram apparatus, or a projector, and a control circuit for controlling the corresponding apparatus. The display device 8260 may be the display device 1000 described with reference to FIGS. 19, 20, and 21, or may be the display device including the display transferring structure illustrated in FIGS. 8, 9, and 13 to 18. The display device 8260 may include touch circuitry set to sense a touch, and/or a sensor circuit (a pressure sensor, etc.) set to measure the intensity of a force generated by the touch.

The audio module 8270 may convert sound to an electric signal, or convert the electric signal to sound. The audio module 8270 may obtain sound through the input apparatus 8250, or may print sound through the speaker and/or a headphone of another electronic apparatus (the electronic apparatus 8202, etc.), which is directly or wirelessly connected to the sound output apparatus 8255 and/or the electronic apparatus 8201.

The sensor module 8276 may sense an operating state (power, temperature, etc.) of the electronic apparatus 8201 or an external environment state (user state, etc.) and may generate an electrical signal and/or data value corresponding to the sensed state. The sensor module 8276 may include a gesture sensor, a gyro sensor, a pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more predetermined protocols that may be used for directly or wirelessly connecting the electronic apparatus 8201 to another electronic apparatus (the electronic apparatus 8202, etc.). The interface 8277 may include a High Definition Multimedia Interface (HDMI), a Universal Serial Bus (USB) interface, an SD card interface, and/or an audio interface.

A connection terminal 8278 may include a connector that may physically connect the electronic apparatus 8201 with another electronic apparatus (the electronic apparatus 8202, etc.). The connection terminal 8278 may include an HDMI connector, a USB connector, an SD card connector, and/or an audio connector (a headphone connector, etc.).

The haptic module 8279 may convert the electric signal to a mechanical signal (vibration, movement, etc.) which may be recognized by the user through tactile sense or kinesthetics. The haptic module 8279 may include a motor, a piezoelectric effect element, and/or an electric stimulation device.

The camera module 8280 may capture still images and movies. The camera module 8280 may include lens assemblies including one or more lenses, image sensors, image signal processors, and/or flashes. The lens assembly included in the camera module 8280 may collect light emitted from the subject for image capturing.

The power management module 8288 may manage power supplied to the electronic apparatus 8201. The power management module 8288 may be implemented as part of a Power Management Integrated Circuit (PMIC).

The battery 8289 may supply power to the components of the electronic apparatus 8201. The battery 8289 may include a rechargeable primary cell, a rechargeable secondary cell, and/or a fuel cell.

The communication module 8290 may support establishing a direct (wire) communication channel and/or a wireless communication channel between the electronic apparatus 8201 and another electronic apparatus (the electronic apparatuses 8202 and 8204, the server 8208, etc.) and performing communication through the established communication channel. The communication module 8290 may be operated independently of the processor 8220 (the application processor, etc.) and may include one or more communication processors that support direct communication and/or wireless communication. The communication module 8290 may include a wireless communication module 8292 (a cellular communication module, a near-field communication module, a global navigation satellite system (GNSS) communication module, etc.) and/or a wired communication module 8294 (a local area network (LAN) communication module, a power line communication module, etc.). Among these communication modules, the corresponding communication module may communicate with another electronic apparatus through the first network 8298 (the near-field communication network such as bluetooth, Wifi Direct, or infrared data association (IrDA)) or a second network 8299 (the far-field communication network such as a cellular network, the Internet, or a computer network (a local area network (LAN), a wide area network (WAN), etc.)). Various types of communication modules may be integrated into one component (a single chip, etc.), or may be implemented with a plurality of components separate from each other (plural chips). The wireless communication module 8292 may check and authenticate the electronic apparatus 8201 in the communication network such as the first network 8298 and/or the second network 8299 using the subscriber information stored in the subscriber identity module 8296 (International mobile subscriber identifier (IMSI), etc.).

The antenna module 8297 may transmit a signal and/or power to the outside (another electronic apparatus, etc.) or receive the signal and/or power from the outside. An antenna may include a radiator consisting of a conductive pattern formed on a substrate (a PCB, etc.). The antenna module 8297 may include one or a plurality of antennas. When a plurality of antennas are included, the communication module 8290 may select an antenna suitable for the communication method used in the communication network such as the first network 8298 and/or the second network 8299 may be selected among the plurality of antennas. Through the selected antenna, a signal and/or power may be transmitted or received between the communication module 8290 and another device. In addition to the antenna, other components (RFIC, etc.) may be included as part of the antenna module 8297.

Some of the components may be linked to each other through communication methods between surrounding apparatuses (buses, general purpose input and output (GPIO), serial peripheral interface (SPI), mobile industry processor interface (MIPI), etc.) and may interchange signals (commands, data, etc.)

Commands or data may be transmitted or received between the electronic apparatus 8201 and the electronic apparatus 8204 external thereto through the server 8208 connected to the second network 8299. The other electronic apparatuses 8202 and 8204 may be the same as or different from the electronic apparatus 8201. All or a part of the operations executed in the electronic apparatus 8201 may be executed in one or more of the other electronic apparatuses, that is, the electronic apparatus 8202, the electronic apparatus 8204, and the server 8208. For example, when the electronic apparatus 8201 is required to perform a function or a service, instead of executing the function or service on its own, the electronic apparatus 8201 may request the one or more other electronic apparatuses to perform some or all of the function or service. One or more other electronic apparatuses that received the request may execute an additional function or service related to the request, and transmit the result of the execution to the electronic apparatus 8201. For this purpose, cloud computing, distributed computing, and/or client-server computing technology may be used.

The display device according to an embodiment may also be applied to mobile apparatuses, vehicles, head-up displays, augmented/virtual reality devices, large scale signage, wearable displays, rollable TVs, and stretchable displays, and the like.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

The invention claimed is:

1. A micro semiconductor chip transferring substrate comprising:
   a mold including a plurality of recesses formed to be recessed in a certain depth from an upper surface; and
   a surface energy reduction pattern formed in region between the plurality of recesses, on the upper surface, the surface energy reduction pattern including a plurality of uneven patterns,
   wherein a depth of each of the plurality of uneven patterns is same as a depth of each of the plurality of recesses.

2. The micro semiconductor chip transferring substrate of claim 1, wherein a width of each of the plurality of uneven patterns is 50% or less of a width of each of the plurality of recesses.

3. The micro semiconductor chip transferring substrate of claim 1, wherein a space between adjacent uneven patterns among the plurality of uneven patterns is less than a width of each of the plurality of recesses.

4. The micro semiconductor chip transferring substrate of claim 3, wherein the space between the adjacent uneven patterns among the plurality of uneven patterns, which is defined as s, satisfy a condition:

$$s<(w1-w2)/2$$

wherein, w1 and w2 refer to the widths of each recess and each uneven pattern, respectively.

5. The micro semiconductor chip transferring substrate of claim 1, wherein the surface energy reduction pattern includes a plurality of convex patterns protruded upwards from the upper surface.

6. The micro semiconductor chip transferring substrate of claim 5, wherein the plurality of convex patterns include a different material from a material of the mold.

7. The micro semiconductor chip transferring substrate of claim 5, wherein the plurality of convex patterns include a metal material.

8. The micro semiconductor chip transferring substrate of claim 5, wherein the surface energy reduction pattern further includes a filling pattern including a different material from a material of the plurality of convex patterns and filling regions between the plurality of convex patterns.

9. The micro semiconductor chip transferring substrate of claim 1, wherein the surface energy reduction pattern and the mold are integrally formed of a same material.

10. The micro semiconductor chip transferring substrate of claim 9, wherein the surface energy reduction pattern includes a plurality of concave patterns recessed from the upper surface of the mold to a lower portion.

11. The micro semiconductor chip transferring substrate of claim 1, wherein the surface energy reduction pattern is formed by roughing the upper surface of the mold.

12. A display transferring structure comprising:
    a micro semiconductor chip transferring substrate; and
    a micro semiconductor chip arranged on any one of the plurality of recesses,
    wherein the micro semiconductor chip transferring substrate includes:
    a mold including a plurality of recesses formed to be recessed in a certain depth from an upper surface; and
    a surface energy reduction pattern formed in region between the plurality of recesses, on the upper surface, the surface energy reduction pattern including a plurality of uneven patterns,
    wherein a depth of each of the plurality of uneven patterns is same as a depth of each of the plurality of recesses.

13. The display transferring structure of claim 12, wherein the width of each uneven pattern is 50% or less of a width of the micro semiconductor chip.

14. The display transferring structure of claim 12, wherein the space between adjacent uneven patterns among the plurality of uneven patterns, which is defined as s, may satisfy a condition:

$$s\leq(w3-w2)/2$$

wherein, w3 and w2 refer to the widths of the micro semiconductor chip and each uneven pattern, respectively.

15. The display transferring structure of claim 14, further comprising a driving circuit configured to drive the micro semiconductor chip.

16. The display transferring structure of claim 15, wherein the driving circuit is arranged inside the micro semiconductor chip transferring substrate.

17. The display transferring structure of claim 15, further comprising a circuit board arranged under the micro semiconductor chip transferring substrate and including the driving circuit.

18. A display device comprising:
    the display transferring structure of claim 12;
    a driving circuit configured to drive the micro semiconductor chip; and
    a color conversion layer arranged on the transferring substrate.

19. An electronic apparatus comprising the display device of claim 18.

\* \* \* \* \*